US007688150B2

(12) United States Patent  
Kurd et al.

(10) Patent No.: US 7,688,150 B2
(45) Date of Patent: Mar. 30, 2010

(54) PLL WITH CONTROLLABLE BIAS LEVEL

(75) Inventors: Nasser A. Kurd, Porland, OR (US); Ravindra B. Venigalla, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 21 days.

(21) Appl. No.: 11/564,776

(22) Filed: Nov. 29, 2006

(65) Prior Publication Data

US 2008/0122550 A1 May 29, 2008

(51) Int. Cl.
*H03L 1/00* (2006.01)
(52) U.S. Cl. ......................................... 331/44; 331/186
(58) Field of Classification Search .................. 331/44, 331/185, 186
See application file for complete search history.

(56) References Cited

U.S. PATENT DOCUMENTS

| | | | |
|---|---|---|---|
| 5,463,352 A * | 10/1995 | Chen | 331/1 R |
| 6,441,660 B1 * | 8/2002 | Ingino, Jr. | 327/156 |
| 6,670,833 B2 | 12/2003 | Kurd | |
| 6,922,111 B2 | 7/2005 | Kurd | |
| 6,922,112 B2 | 7/2005 | Kurd | |
| 7,042,259 B2 | 5/2006 | Kurd | |
| 7,282,966 B2 | 10/2007 | Narendra | |
| 7,342,426 B2 | 3/2008 | Kurd | |
| 2008/0101523 A1 | 5/2008 | Kurd | |
| 2008/0111646 A1 * | 5/2008 | Nair | 331/185 |
| 2008/0231352 A1 | 9/2008 | Kurd | |

* cited by examiner

*Primary Examiner*—Robert Pascal
*Assistant Examiner*—James E Goodley
(74) *Attorney, Agent, or Firm*—Erik R. Nordstrom

(57) ABSTRACT

Embodiments disclosed herein may provide circuits having two or more different supplies to separately power analog and digital components in a circuit. In some embodiments, circuits such as PLLs may be provided with adjustable analog supplies. Other embodiments may be disclosed and/or claimed herein.

19 Claims, 3 Drawing Sheets

PLL WITH CONTROLLABLE BIAS LEVEL

BACKGROUND

Many integrated circuit devices such as processors incorporate circuits using both digital and analog signals and thus have both analog and digitally biased transistors. However, the gap between digital and analog transistor requirements is ever increasing. For example, digital transistors may require lower supply voltages in order to meet reduced power consumption requirements with their smaller channel lengths to meet faster speeds. On the other hand, analog transistors may perform better with higher supplies to achieve larger voltage headroom. Reduced analog voltage headroom translates to reduced robustness and degraded performance. Unfortunately, as the trend to optimize processes for digital circuit needs continues (pushing supplies lower), voltage headroom is shrinking making it difficult to achieve desired performance in analog circuit portions. Accordingly, new circuits and techniques are desired.

BRIEF DESCRIPTION OF THE DRAWINGS

Embodiments of the invention are illustrated by way of example, and not by way of limitation, in the figures of the accompanying drawings in which like reference numerals refer to similar elements.

DETAILED DESCRIPTION

Embodiments disclosed herein relate to techniques for implementing circuits such as phase locked loops (PLLs) with both digitally and analog biased transistors. In some embodiments, separate supplies may be used for the analog and digital transistors, thereby allowing for a higher analog supply to attain higher achievable voltage headroom. This can be achieved, even with processes providing relatively small transistors, because most analog transistors are typically not fully biased. Additionally, in some embodiments, an adjustable analog supply may be provided to calibrate analog circuits (or circuit portions) to operate in accordance with desired operating parameters.

Figure 1:
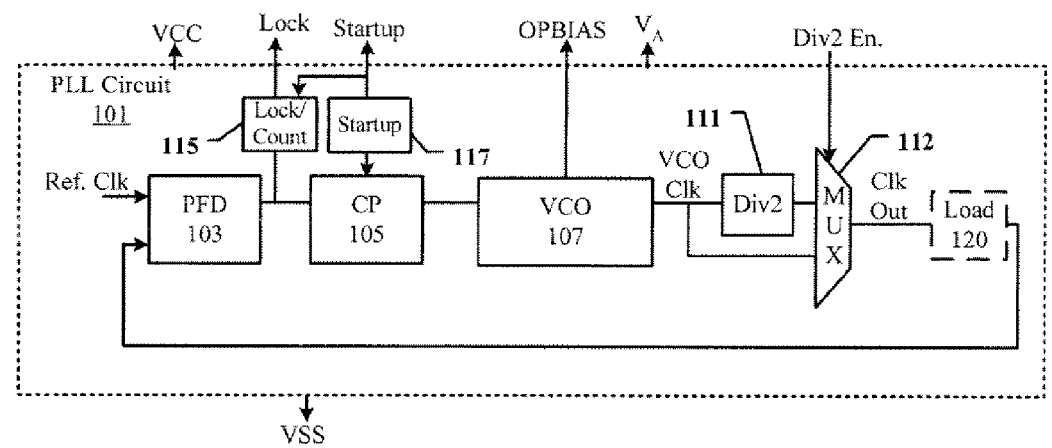
FIG. 1 is a schematic diagram of a conventional phase locked loop (PLL) circuit.

FIG. 1 generally shows a PLL circuit 101 to generate an output clock tracking an applied reference clock (Clk Out) for a load 120. The PLL circuit 101 is supplied both with power from a digital supply (VCC) and from a higher analog supply ($V_A$). In this way, the digital component transistors (e.g., those used for logic gates and the like) can be powered with the lower supply, for example, to meet process/leakage objectives. On the other hand, the analog biased transistors (e.g., those such as transistors in a voltage controlled oscillator, not fully biased) can have higher available voltages for additional headroom.

The PLL circuit 101 generally comprises a phase frequency detector 103, charge pump 105, voltage controlled oscillator 107, divide-by-2 (Div2) circuit 111, 2:1 multiplexer 112, Lock/Count circuit 115, and Startup circuit 117. The phase frequency detector 103 is coupled to the charge pump 105, which in turn is coupled to the voltage controlled oscillator (VCO) 107 to generate an output VCO Clk signal. The VCO Clk signal is coupled to clock load 120, either through the Div2 circuit 111 or around it, depending on which path in the multiplexer 112 is selected. From the clock load 120, the output clock signal is fedback to an input of the phase frequency detector 103.

The phase frequency detector 103 compares the phase/frequency of the fedback output clock with the reference clock phase/frequency and increases or decreases charge on the charge pump, based on which signal is ahead of the other, to increase or decrease the VCO clock phase/frequency. If the output clock is ahead of the reference clock, the phase frequency detector controls the charge pump to reduce the phase/frequency of the VCO clock; conversely, if it is behind the reference clock, the VCO is controlled to increase the VCO clock phase/frequency.

A Div2 enable (Div2 En.) signal controls multiplexer 112 to determine whether or not the Div2 circuit 111 is engaged. If it is engaged, it provides to the clock load 120 a clock with a frequency half that of the VCO clock. Thus, engaging it causes the VCO to operate at twice its normal frequency (i.e., twice the output clock frequency) but does not change the frequency provided to the clock load 120. In some embodiments, it may be desirable (as discussed below) to overdrive the VCO in this manner.

The Startup circuit 117 is coupled to the charge pump 105 to initiate startup of the PLL and to set a precharge startup level for startup. In some embodiments, the charge pump 105 can be precharged to a specified level to effectively "jump start" the PLL. Thus, as with any signal disclosed herein, the Startup signal may actually comprise one or more signal lines to not only convey a startup initiation signal, but also, to provide a value indicating a startup level.

The LockCount circuit is coupled to the phase frequency detector (or phase frequency detector output) to provide a lock indication signal (Lock) indicating if the PLL is locked or not. In some embodiments, it may also comprise a counter/timer to count elapsed time from a startup initiation to the time when the PLL locks. As will be addressed below, this may be useful in calibrating PLL operation. For example, if it is indicated (through the Lock signal) that the counter "counted out," it may be determined that the PLL should be restarted. The OPBIAS signal is a signal indicating a bias level within the VCO. It will be addressed further below, but it can be used as a way to determine how effectively and/or efficiently the PLL is operating.

It should be appreciated that the PLL components and configurations may be implemented with any suitable design, conventional or otherwise. With regard to the calibration circuit discussed below, any suitable operating parameter, affected by a controllably adjustable supply, may be controlled, either directly or indirectly, to attain one or more desired operating parameters. For example, the VCO 107 may be implemented with one or more cascaded delay circuits, such as the delay circuit 200 of FIG. 2, and the operational bias level of one or more bias signals may be calibrated, as discussed below in accordance with some embodiments.

Figure 2:
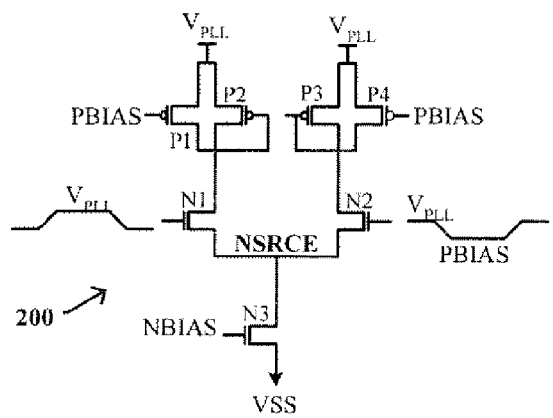
FIG. 2 is a schematic diagram of a delay circuit for a voltage controlled oscillator for use in the PLL of FIG. 1.

With reference to FIG. 2, delay circuit 200 generally comprises controllably biased PMOS load transistors P1 to P4, input NMOS transistors N1, N2, and biased current source NMOS transistor N3, coupled together as indicated. (Note that the term "PMOS transistor" refers to a P-type metal oxide semiconductor field effect transistor. Likewise, "NMOS transistor" refers to an N-type metal oxide semiconductor field effect transistor. It should be appreciated that whenever the terms: "transistor", "MOS transistor", "NMOS transistor", or "PMOS transistor" are used, unless otherwise expressly indicated or dictated by the nature of their use, they are being used in an exemplary manner. They encompass the different varieties of MOS devices including devices with different VTs and oxide thicknesses to mention just a few. Moreover, unless specifically referred to as MOS or the like, the term transistor can include other suitable transistor types, e.g., junction-field-effect transistors, bipolar-junction transistors, and various types of three dimensional transistors, known today or not yet developed.)

The delay stage receives a differential clock at the gate inputs of N1 and N2 and provides a differential output clock at their drains. A PBIAS signal is applied to the gate inputs of P1-P4, and an NBIAS signal is applied to the gate of N3 to bias the circuit for desired operation, e.g., response, drive capability, or the like.

Figure 3:
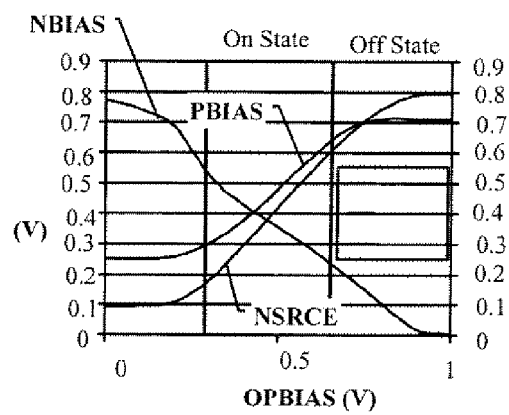
FIG. 3 is a graph showing exemplary bias signals for the delay circuit of FIG. 2.

FIG. 3 is a graph showing the PBIAS, BIAS, and NSRCE signals as a function of an operational bias (OPBIAS) indication signal. (The OPBIAS signal is available from the CP (105) and indicates the operation of the VCO in accordance with the curves in FIG. 3. It may be derived or replicated from any suitable place in the PLL that accurately indicates the relative values of NBIAS and PBIAS to monitor operation of the VCO in a desired manner. For example, as discussed below with reference to FIG. 4, it may be desirable to control the VCO so that the delay stage(s) operates with OPBIAS set and/or maintained within a desired range.)

Figure 4:
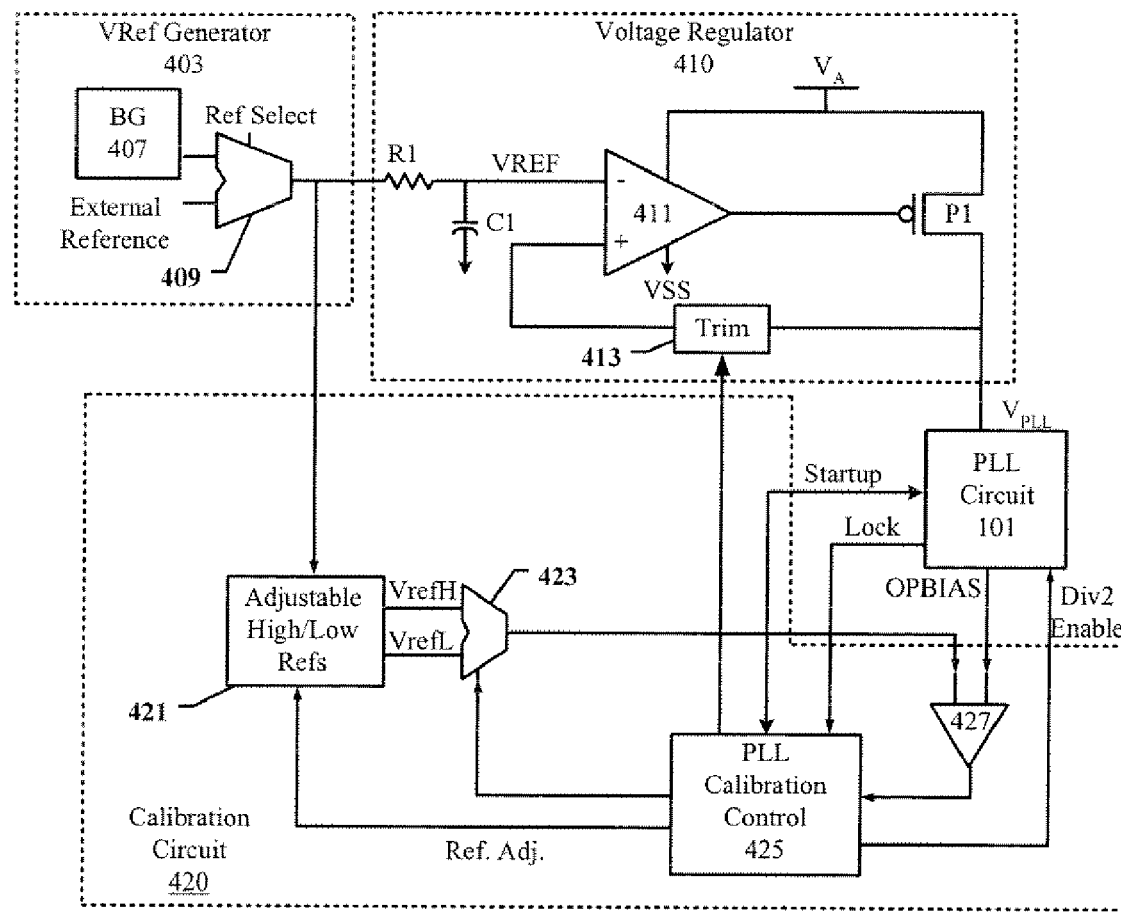
FIG. 4 is a schematic diagram of a calibration circuit to calibrate a PLL such as the phase locked loop circuit of FIG. 1 in accordance with some embodiments

FIG. 4 shows a PLL 101 with accompanying circuitry to calibrate it so that it operates within a desired biasing range (e.g., so that a signal such as OPBIAS from FIG. 2 is within a desired range). The circuitry generally comprises a voltage reference generator 403, a voltage regulator 410, and a PLL calibration circuit 420. In some embodiments, the circuit is supplied by both a digital supply (not shown) and a higher analog supply (V.sub.A) to supply power for the regulator so that it can provide an adjustable analog supply to the PLL 101, which is also powered by the digital supply for its digitally biased components.

The voltage reference generator 403 is coupled to the voltage regulator and to the calibration circuit to provide an accurate reference voltage. It comprises a 2:1 multiplexer 409 having inputs coupled to a bandgap reference circuit and to an external reference. It has a reference select (Ref Select) input to select one of these references to be provided to the regulator 410 and calibration control circuit 420. In some embodiments, the Ref. Select may be coupled to a fuse to set the selection, e.g., during a manufacturing phase based on test results or the like.

The voltage regulator 410 generates a controllably adjustable analog supply voltage ($V_{PLL}$) for the PLL 101. It comprises an amplifier 411, MOS drive transistor P1, filter capacitor C1 and resistor R1, and a controllably adjustable resistor divider (trim) 413. The filter resistor R1 and capacitor C1 are coupled to form a low-pass filter to effectively couple a selected reference (VREF) from reference generator 403 to the input (negative input) of the amplifier 411.

The amplifier 411 is coupled to the gate of P1 to inversely drive it relative to the regulated PLL supply $V_{PLL}$, which is provided from the drain of P1. With this configuration, the $V_{PLL}$ output is coupled through the trim 413 back to the positive input of the amplifier 411 to provide it with negative feedback. The source of P1, along with a supply rail for the amplifier 411, is coupled to a supply voltage $V_A$ that is sufficiently higher than the designed operating range of the PLL supply $V_{PLL}$.

In some embodiments, the trim 413 comprises a controllably adjustable resistor divider, coupling back to the amplifier 411 an adjustable portion of the regulated output supply $V_{PLL}$. For example, the coupled back portion may be $V_{PLL}/R$, where R ranges between 1 and some value. In this way, the PLL supply $V_{PLL}$ could be controlled to be between VREF and some value approaching $V_A$.

The PLL calibration circuit 420 comprises an adjustable high/low reference circuit 421, a 2:1 multiplexer 423, PLL calibration control circuit 425, and comparator 427. The adjustable high/low reference circuit 421 comprises controllably adjustable resistor divider circuits coupled to the selected reference voltage from reference generator 403 to generate controllably adjustable high and low voltage references ($V_{refH}$ and $V_{refL}$). A Ref. Adjust control signal(s) is coupled to the adjustable high/low reference circuit 421 from the calibration control circuit 425 to control the levels of $V_{refH}$ and $V_{refL}$, which are coupled to the inputs of the multiplexer 423. The multiplexer output is coupled to an input of the comparator 427, while the other comparator input is coupled to an operation indication signal (OPBIAS in the depicted embodiment) to be compared with either VrefH or VrefL, depending on which reference is selected by the calibration control circuit 425. The comparator output is coupled to the calibration control circuit 425.

The calibration control circuit 425 is also coupled to a "Lock" indication signal from the PLL 101, indicating whether the PLL is locked and if a lock overcount condition occurred. It is also coupled to the PLL through a "Startup" signal to control where the PLL is to start and to assess from the PLL if the startup has occurred. (In some embodiments, the PLL may set a precharge level, e.g., in a charge pump for a PLL "jump start.") The calibration control circuit 425 also has a Div2 Enable signal coupled to the PLL 101 to activate or deactivate a divide by 2 function to double the frequency generated by the VCO within the PLL.

Figure 5:
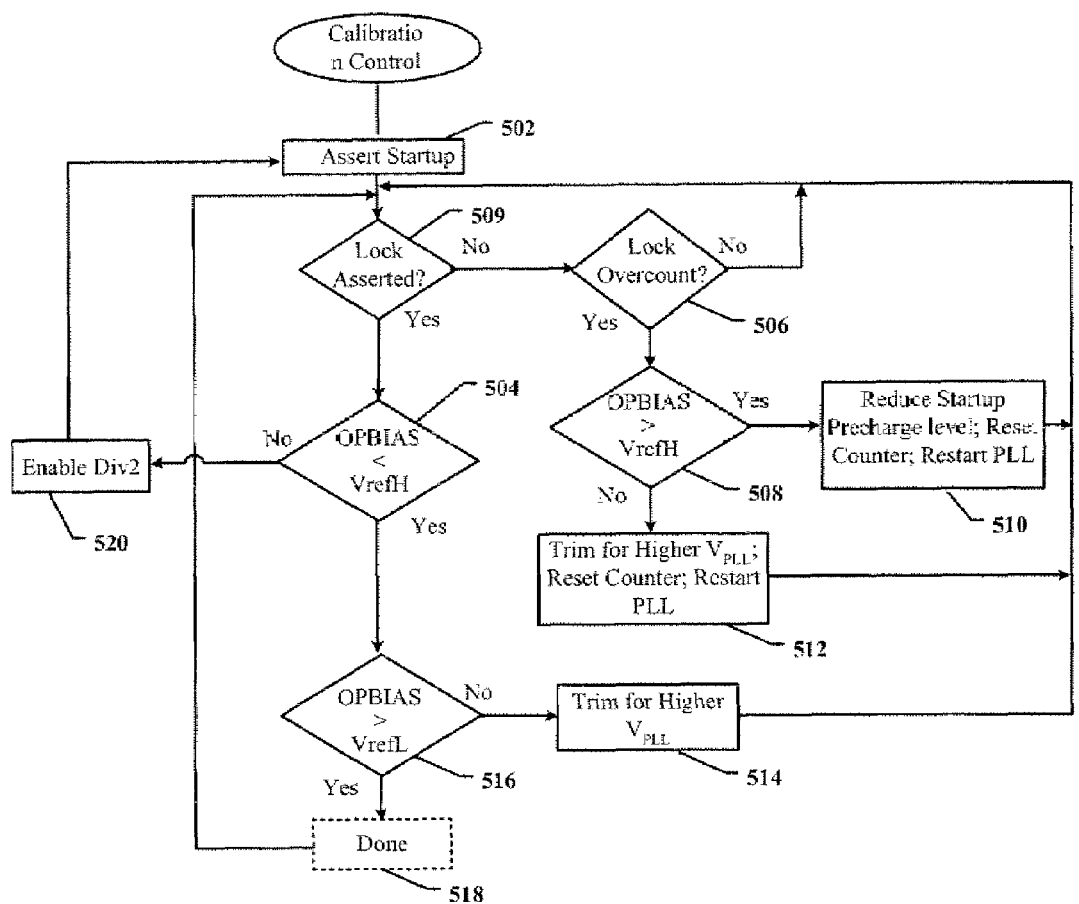
FIG. 5 is a flow diagram of a routine to calibrate a PLL with the calibration circuit of FIG. 4 in accordance with some embodiments.

FIG. 5 shows a routine for implementing a calibration control circuit 425 in accordance with some embodiments. Initially, at 502, the control circuit 425 initiates startup via the startup signal(s). A default startup level (e.g., charge pump precharge level) may be used to implement a PLL jump start to achieve PLL lock more quickly. At 509, the control circuit determines (after a sufficient amount of time) whether the PLL is locked. If so, it proceeds to 504 and determines whether the OPBIAS level is less than the $V_{refH}$ reference. If so, it proceeds to 516 to determine if OPBIAS is greater than the $V_{refL}$ reference level. If so (indicating that the OPBIAS is within a predefined operating range, $V_{refL}$<OPBIAS<$V_{refH}$), the routine may stop at 518 if the calibration is to be a one-time event (e.g., at power-up). Alternatively, it may return back to decision step 509 for continual calibration of the PLL while it is in operation.

Returning back to decision step 516, if the OPBIAS level was below the $V_{refL}$ (indicating an out-of-range low condition), then at 514, the control circuit controls the trim 413 to increase the PLL supply voltage ($V_{PLL}$), which increases the OPBIAS level (thereby controlling the VCO to operate at a more favorable bias condition). In some embodiments, this increase in $V_{PLL}$ is done without turning off the PLL, i.e., it is done on the fly. From here, the routine returns back to decision step 509 to again confirm that it is locked and proceeds as previously described.

Returning back to decision step 504, if the OPBIAS level was not less than $V_{refH}$ (indicating an out-of-range high condition), it proceeds to 520 and activates the Div2 function to cause the VCO to run at twice the frequency. This results in the OPBIAS level being reduced. (Note that whether the PLL supply VPLL is changed or whether the Div2 function is enabled, the PLL continues to generate a clock with a frequency corresponding to a reference clock applied at its input. In this calibration embodiment, the operating bias level is being controlled, indirectly, to occur within a desired range, i.e., where $V_{refL}$<OPBIAS<$V_{refH}$. Increasing the PLL supply increases the operating bias parameter, OPBIAS, while activating the Div2 function decreases it, but they don't necessarily materially affect the output frequency. In other embodiments, different parameters may be calibrated using the same or similar techniques. For example, in the depicted embodiment, the OPERAS level is lowered by activating a Div2 function. However, persons of skill will appreciate that alternatively, it could be lowered by reducing the PLL supply or by some other suitable approach. These and other techniques are contemplated and within the scope of the invention.)

Returning back to step 509, if the PLL is not locked, then the routine proceeds to step 506 to determine if the lock counter counted out. (In some embodiments, the PLL may have a timer, i.e., a counter, to track how long the PLL attempts to lock once it is started. Along with indicating whether the PLL is locked, the Lock signal may also indicate whether the lock counter has counted out.) If it has not counted out yet, the routine simply loops back to 509 to once again check to see if the PLL is locked. It continues loping back to 509 until the PLL locks or until the Lock signal indicates an overcount.

On the other hand, if at 506, an overcount is confirmed, then the routine proceeds to 508 to determine if the OPBIAS level is too high, i.e., greater than $V_{refH}$. If so (indicating that the PLL supply is probably sufficiently high but possibly the startup precharge level was too high at startup), the routine goes to 510 where it reduces the startup precharge level, resets the lock overcount counter, restarts the PLL, and returns to step 509 to determine if the PLL is locked.

If at 508, it determined that the OPBIAS level was not greater than $V_{refH}$, then the routine proceeds to 512 and controls the trim 413 to increase the PLL supply voltage, $V_{PLL}$, resets the lock counter and restarts the PLL. From here, it returns back to 509 to confirm if the PLL is locked.

Figure 6:
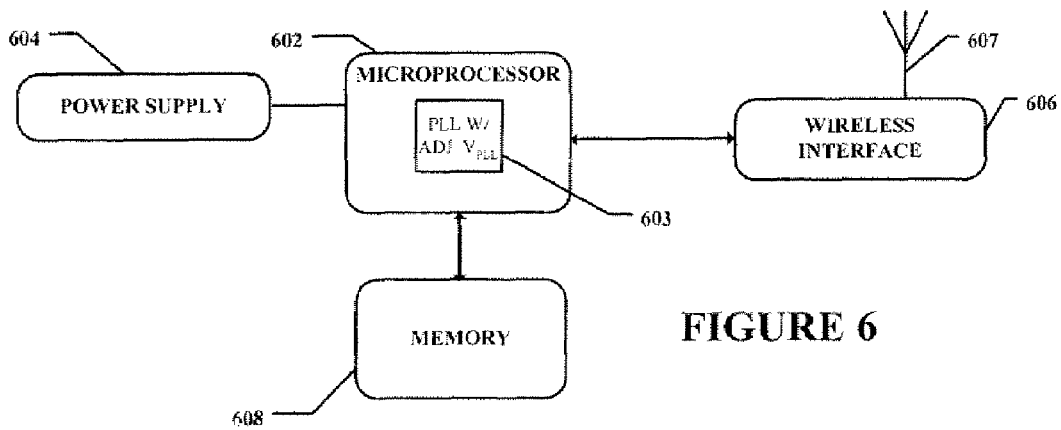
FIG. 6 is a block diagram of a computer system having a processor with at least one PLL with an adjustable analog supply in accordance with some embodiments.

With reference to FIG. 6, one example of a computer system is shown. The depicted system generally comprises a processor 602 coupled to a power supply 604, a wireless interface 606, and memory 608. It is coupled to the power supply (e.g., regulator powered by an adapter or battery) 604 to receive from it power when in operation. The wireless interface 606 is coupled to an antenna 607 to communicatively link the processor through the wireless interface chip 606 to a wireless network (not shown). Microprocessor 602 comprises one or more PLLs 603 with a controllably adjustable PLL supply, as set forth above.

It should be noted that the depicted system could be implemented in different forms. That is, it could be implemented in a single chip module, a circuit board, or a chassis having multiple circuit boards. Similarly, it could constitute one or more complete computers or alternatively, it could constitute a component useful within a computing system.

The invention is not limited to the embodiments described, but can be practiced with modification and alteration within the spirit and scope of the appended claims. For example, it should be appreciated that the present invention is applicable for use with all types of semiconductor integrated circuit ("IC") chips. Examples of these IC chips include but are not limited to processors, controllers, chip set components, programmable logic arrays (PLA), memory chips, network chips, and the like.

Moreover, it should be appreciated that example sizes/models/values/ranges may have been given, although the present invention is not limited to the same. As manufacturing techniques (e.g., photolithography) mature over time, it is expected that devices of smaller size could be manufactured. In addition, well known power/ground connections to IC chips and other components may or may not be shown within the FIGS. for simplicity of illustration and discussion, and so as not to obscure the invention. Further, arrangements may be shown in block diagram form in order to avoid obscuring the invention, and also in view of the fact that specifics with respect to implementation of such block diagram arrangements are highly dependent upon the platform within which the present invention is to be implemented, i.e., such specifics should be well within purview of one skilled in the art. Where specific details (e.g., circuits) are set forth in order to describe example embodiments of the invention, it should be apparent to one skilled in the art that the invention can be practiced without, or with variation of, these specific details. The description is thus to be regarded as illustrative instead of limiting.

What is claimed is:

1. An integrated circuit, comprising:
   a phase locked loop (PLL) circuit having both digitally and analog biased components, the digitally biased components to be powered with a digital supply;
   at least some of the analog biased components to be powered by a separate controllably adjustable analog supply that can be higher than the digital supply; and
   a calibration circuit to monitor a bias level of the at least some analog biased components and control the bias level by controlling an operating frequency of the PLL.

2. The integrated circuit of claim 1, in which the PLL circuit has at least one biased, voltage controlled oscillator (VCO).

3. The integrated circuit of claim 2, wherein the calibration circuit is to increase the controllably adjustable analog supply if the VCO is insufficiently biased.

4. The integrated circuit of claim 3, in which the calibration circuit causes the VCO to drive at a higher frequency if it is excessively biased.

5. The integrated circuit of claim 3, in which the calibration circuit determines if the VCO is insufficiently biased by comparing a signal from the PLL with a low reference level.

6. The integrated circuit of claim 5, in which the low reference level is adjustable.

7. The integrated circuit of claim 4, in which the calibration circuit determines if the VCO is excessively biased by comparing a signal from the PLL with a high reference level.

8. The integrated circuit of claim 7, in which the high reference level is adjustable.

9. An integrated circuit, comprising:
   a voltage regulator;
   a PLL coupled to the voltage regulator to receive from it a controllably adjustable analog voltage supply, the PLL to also have a digital supply; and
   a calibration circuit coupled to the PLL and to the voltage regulator to increase the controllably adjustable analog voltage supply if a bias signal in the PLL is not large enough and to increase an operating frequency of the PLL if the bias signal is too large.

10. The integrated circuit of claim 9, in which the PLL has at least one biased, voltage controlled oscillator (VCO), and the calibration circuit increases the controllably adjustable voltage supply if the VCO is insufficiently biased.

11. The integrated circuit of claim 10, in which the calibration circuit determines if the VCO is insufficiently biased by comparing the bias signal from the PLL with a low reference level.

12. The integrated circuit of claim 11, in which the low reference level is adjustable.

13. The integrated circuit of claim 9, in which the calibration circuit determines if the VCO is excessively biased by comparing the bias signal from the PLL with a high reference level.

14. The integrated circuit of claim 13, in which the high reference level is adjustable.

15. The integrated circuit of claim 9, in which the calibration circuit comprises a finite state machine to adjust the voltage regulator if it determines that the PLL is not operating in a predefined manner.

16. A system, comprising:
   (a) a processor chip comprising:
      a voltage regulator,
      a PLL coupled to the voltage regulator to receive from it a controllably adjustable analog voltage supply, the PLL also having a digital supply, and
      a calibration circuit coupled to the PLL and to the voltage regulator to increase the controllably adjustable analog voltage supply if a bias level in the PLL is insufficient and to increase an operating frequency within the PLL if the bias level is excessive;
   (b) a memory chip coupled to said processor chip to provide it with random access memory; and
   (c) an antenna coupled to said processor chip to communicatively link it with a wireless network.

17. The system of claim 16, in which the memory chip is coupled to the processor chip through the PLL to communicate with said processor chip.

18. The system of claim 16, in which said calibration circuit controls the voltage regulator to increase the adjustable voltage supply if it determines that the PLL is under biased.

19. The system of claim 18, in which the calibration circuit causes the PLL to be overdriven if it determines that the PLL is overbiased.

* * * * *